(12) United States Patent
Terasaki

(10) Patent No.: US 12,451,404 B2
(45) Date of Patent: *Oct. 21, 2025

(54) COPPER-CERAMIC BONDED BODY, INSULATED CIRCUIT BOARD, METHOD FOR PRODUCING COPPER-CERAMIC BONDED BODY, AND METHOD FOR PRODUCING INSULATED CIRCUIT BOARD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 159 days.

This patent is subject to a terminal disclaimer.

(21) Appl. No.: 17/781,250

(22) PCT Filed: Nov. 30, 2020

(86) PCT No.: PCT/JP2020/044547
§ 371 (c)(1),
(2) Date: May 31, 2022

(87) PCT Pub. No.: WO2021/112046
PCT Pub. Date: Jun. 10, 2021

(65) Prior Publication Data
US 2023/0034784 A1    Feb. 2, 2023

(30) Foreign Application Priority Data

Dec. 6, 2019   (JP) ................................. 2019-221364
Nov. 24, 2020  (JP) ................................. 2020-194601

(51) Int. Cl.
*H01L 23/373*   (2006.01)
*B32B 7/12*     (2006.01)
(Continued)

(52) U.S. Cl.
CPC ............ *H01L 23/3735* (2013.01); *B32B 7/12* (2013.01); *B32B 9/005* (2013.01); *B32B 9/041* (2013.01);
(Continued)

(58) Field of Classification Search
CPC ... B22F 1/05; B22F 7/04; B22F 9/082; B23K 1/0016; B23K 1/19; B23K 35/007;
(Continued)

(56) References Cited

U.S. PATENT DOCUMENTS

| | | | |
|---|---|---|---|
| 11,881,439 B2 * | 1/2024 | Terasaki | B23K 20/026 |
| 2003/0068532 A1 * | 4/2003 | Tsukaguchi | C04B 35/581 |
| | | | 428/698 |

(Continued)

FOREIGN PATENT DOCUMENTS

| | | |
|---|---|---|
| CN | 104409425 A | 3/2015 |
| CN | 109417056 A | 3/2019 |

(Continued)

OTHER PUBLICATIONS

International Search Report mailed Oct. 20, 2020, issued for PCT/JP2020/030787 and English translation thereof.

(Continued)

*Primary Examiner* — Xiaobei Wang
(74) *Attorney, Agent, or Firm* — Troutman Pepper Locke LLP; James E. Armstrong, IV; Nicholas J. DiCeglie, Jr.

(57) ABSTRACT

A copper-ceramic bonded body includes a copper member made of copper or a copper alloy, and a ceramic member made of silicon nitride, the copper member and the ceramic member being bonded to each other, in which a maximum length of a Mg—N compound phase which is present at a bonded interface between the copper member and the ceramic member is less than 100 nm, and in a unit length along the bonded interface, the number density of the (Continued)

Mg—N compound phase in a range of a length of 10 nm or more and less than 100 nm is less than 8 pieces/μm.

6 Claims, 4 Drawing Sheets

(51) Int. Cl.
| | |
|---|---|
| *B32B 9/00* | (2006.01) |
| *B32B 9/04* | (2006.01) |
| *B32B 15/20* | (2006.01) |
| *B32B 37/18* | (2006.01) |
| *C04B 37/02* | (2006.01) |
| *H01L 21/48* | (2006.01) |
| *H01L 23/00* | (2006.01) |
| *H01L 23/46* | (2006.01) |
| *H05K 1/03* | (2006.01) |
| *H05K 3/38* | (2006.01) |

(52) U.S. Cl.
CPC .............. *B32B 15/20* (2013.01); *B32B 37/18* (2013.01); *C04B 37/023* (2013.01); *H01L 21/4857* (2013.01); *H05K 1/0306* (2013.01); *H05K 3/381* (2013.01); *H05K 3/382* (2013.01); *H05K 3/388* (2013.01); *B32B 2250/02* (2013.01); *B32B 2255/205* (2013.01); *B32B 2311/00* (2013.01); *B32B 2311/12* (2013.01); *B32B 2315/02* (2013.01); *B32B 2457/08* (2013.01); *C04B 2237/12* (2013.01); *C04B 2237/368* (2013.01); *C04B 2237/407* (2013.01); *H01L 23/46* (2013.01); *H01L 24/29* (2013.01); *H01L 24/32* (2013.01); *H01L 2224/29109* (2013.01); *H01L 2224/29111* (2013.01); *H01L 2224/29139* (2013.01); *H01L 2224/29147* (2013.01); *H01L 2224/32225* (2013.01); *H01L 2924/0132* (2013.01); *H01L 2924/0133* (2013.01); *H01L 2924/10253* (2013.01); *H05K 2203/06* (2013.01)

(58) Field of Classification Search
CPC ............ B23K 35/0233; B23K 35/0244; B23K 35/025; B23K 35/3006; B23K 35/3601; B23K 35/3613; B23K 35/383; B23K 2101/36; B23K 2101/42; B23K 2103/12; B23K 2103/18; B23K 2103/52; B32B 3/30; B32B 7/12; B32B 9/005; B32B 9/041; B32B 15/20; B32B 2307/732; B32B 2457/08; C04B 37/02; C04B 37/023; C04B 37/026; C04B 2235/6567; C04B 2235/6581; C04B 2235/343; C04B 2235/348; C04B 2235/365; C04B 2235/366; C04B 2235/407; C04B 2235/52; C22C 9/00; H01L 23/12; H01L 23/14; H01L 23/15; H01L 23/3755; H05K 1/0306; H05K 1/09; H05K 3/388; H05K 2201/0355; H05K 2303/1126

See application file for complete search history.

(56) References Cited

U.S. PATENT DOCUMENTS

| | | |
|---|---|---|
| 2015/0016842 A1 | 1/2015 | Sabu et al. |
| 2018/0346387 A1 | 12/2018 | Terasaki et al. |
| 2020/0006213 A1 | 1/2020 | Terasaki |
| 2021/0178509 A1 | 6/2021 | Terasaki |

FOREIGN PATENT DOCUMENTS

| | | | | |
|---|---|---|---|---|
| EP | 3960722 A1 | | 3/2022 | |
| JP | 2001-217362 A | | 8/2001 | |
| JP | 3211856 B2 | | 9/2001 | |
| JP | 2004255416 A | * | 9/2004 | |
| JP | 2005305526 A | * | 11/2005 | |
| JP | 4375730 B2 | | 12/2009 | |
| JP | 2017-108107 A | | 6/2017 | |
| JP | 2017183716 A | * | 10/2017 | |
| JP | 2018140929 A | * | 9/2018 | ............ C04B 37/02 |
| TW | 201542496 A | | 11/2015 | |
| WO | 2017/090422 A1 | | 6/2017 | |
| WO | 2018/159590 A1 | | 9/2018 | |
| WO | 2019/088222 A1 | | 5/2019 | |
| WO | 2020/044593 A1 | | 3/2020 | |
| WO | 2020/045388 A1 | | 3/2020 | |

OTHER PUBLICATIONS

Office Action mailed Apr. 24, 2022, issued for Chinese Patent Application No. 202080052355.9 and English translation thereof.
Supplementary European Search Report mailed May 23, 2022, issued for European Patent Application No. 20855157.2.
Office Action dated Apr. 19, 2023, issued for U.S. Appl. No. 17/613,247.
Office Action dated May 23, 2023, issued for U.S. Appl. No. 17/613,247.
International Search Repot mailed Jan. 19, 2021, issued for PCT/JP2020/044547 and English translation thereof.
Office Action mailed Nov. 16, 2022, issued for Chinese Patent Application No. 202080083468.5 and English translation of the Search Report.
Office Action mailed Oct. 2, 2023, issued for TW109128044 and the English translation of the Search Report.
L. Mueller et al., "Magnesia and Yttria Based Coatings for Direct-Copper-Bonding of Silicon Nitride Ceramics", Advanced Ceramic Coatings and Interfaces IV, Nov. 9, 2009, pp. 21-32. (cited in the Nov. 27, 2023 Search Report issued for EP20896480.9).
Supplementary European Search Report dated Nov. 27, 2023, issued for European Patent Application No. 20896480.9.

* cited by examiner

COPPER-CERAMIC BONDED BODY, INSULATED CIRCUIT BOARD, METHOD FOR PRODUCING COPPER-CERAMIC BONDED BODY, AND METHOD FOR PRODUCING INSULATED CIRCUIT BOARD

TECHNICAL FIELD

The present invention relates to a copper-ceramic bonded body in which a copper member made of copper or a copper alloy and a ceramic member made of silicon nitride are bonded to each other, an insulated circuit board in which a copper sheet made of copper or a copper alloy is bonded to a surface of a ceramic substrate, a method for producing a copper-ceramic bonded body, and a method for producing an insulated circuit board.

Priority is claimed on Japanese Patent Application No. 2019-221364, filed Dec. 6, 2019, and Japanese Patent Application No. 2020-194601, filed Nov. 24, 2020, the contents of which are incorporated herein by reference.

BACKGROUND ART

A power module, an LED module, and a thermoelectric module have a structure in which a power semiconductor element, an LED element, and a thermoelectric element are bonded to an insulated circuit board in which a circuit layer made of a conductive material is formed on one surface of an insulating layer.

For example, a power semiconductor element for high-power control used for controlling a wind power generation, an electric vehicle, a hybrid vehicle, or the like has a large amount of heat generated during operation. Therefore, as a substrate on which the power semiconductor element is mounted, an insulated circuit board including a ceramic substrate and a circuit layer formed by bonding a metal plate having excellent conductivity to one surface of the ceramic substrate has been widely used in the related art. As the insulated circuit board, one having a metal layer formed by bonding a metal plate to the other surface of the ceramic substrate is also provided.

For example, Patent Document 1 proposes an insulated circuit board in which a circuit layer and a metal layer are formed by bonding a copper sheet to one surface and the other surface of a ceramic substrate. In Patent Document 1, the copper sheet is disposed on one surface and the other surface of the ceramic substrate with an Ag—Cu—Ti-based brazing material interposed therebetween, and the copper sheet is bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheet are satisfactorily bonded to each other.

Patent Document 2 proposes an insulated circuit board in which a ceramic substrate and a copper sheet are bonded to each other by using a Cu—Mg—Ti-based brazing material.

In Patent Document 2, a configuration in which bonding is achieved by heating at 560° C. to 800° C. in a nitrogen gas atmosphere is provided, and Mg in a Cu—Mg—Ti alloy sublimates and does not remain at a bonded interface, while titanium nitride (TiN) is not substantially formed.

CITATION LIST

Patent Documents

[Patent Document 1]
Japanese Patent No. 3211856
[Patent Document 2]
Japanese Patent No. 4375730

SUMMARY OF INVENTION

Technical Problem

By the way, recently, the insulated circuit board tends to be loaded with a large current and a high voltage. Therefore, in the insulated circuit board, it is required to improve the insulating property of the ceramic substrate.

The invention has been made in view of the above-described circumstances, and an objective thereof is to provide a copper-ceramic bonded body, an insulated circuit board, a method for producing a copper-ceramic bonded body, and a method for an insulated circuit board, which are excellent in insulating properties.

Solution to Problem

In order to solve the above-described problem, a copper-ceramic bonded body according to the present invention includes a copper member made of copper or a copper alloy, and a ceramic member made of silicon nitride, the copper member and the ceramic member being bonded to each other, in which a maximum length of a Mg—N compound phase which is present at a bonded interface between the copper member and the ceramic member is less than 100 nm, and in a unit length along the bonded interface, the number density of the Mg—N compound phase in a range of a length of 10 nm or more and less than 100 nm is less than 8 pieces/µm.

According to the copper-ceramic bonded body according to the present invention, since the maximum length of the Mg—N compound phase which is present at the bonded interface between the copper member and the ceramic member is less than 100 nm, and in the unit length along the bonded interface, the number density of the Mg—N compound phase in the range of the length of 10 nm or more and less than 100 nm is less than 8 pieces/µm, occurrence of electric field concentration caused by the Mg—N compound phase which is present at the bonded interface can be suppressed. Accordingly, the insulating property of the copper-ceramic bonded body can be sufficiently improved.

Here, in the copper-ceramic bonded body according to the present invention, it is preferable that the ceramic member includes silicon nitride phases and a glass phase formed between the silicon nitride phases, and Cu atoms are present inside the glass phase located on a side of the copper member.

In this case, since the ceramic member includes the silicon nitride phases and the glass phase formed between the silicon nitride phases, and the Cu atoms are present inside the glass phase located on the copper member side, an interfacial reaction between the ceramic member and the copper member is sufficiently performed, and bonding reliability is particularly excellent.

In the copper-ceramic bonded body according to the present invention, it is preferable that assuming that the total amount of Mg, N, and Si in the Mg—N compound phase is 100 atomic %, a Si concentration is 25 atomic % or less.

In this case, since the Si concentration in the Mg—N compound phase is 25 atomic % or less, local precipitation of a Si single phase inside the Mg—N compound phase can be suppressed, and the strength of the Mg—N compound phase can be sufficiently secured. Thereby, it is possible to suppress cracks in the Mg—N compound phase when a load is applied to the bonded interface by ultrasonic bonding of a terminal material, and to maintain an anchor effect by the Mg—N compound phase.

An insulated circuit board according to the present invention includes a copper sheet made of copper or a copper alloy, and a ceramic substrate made of silicon nitride, the copper sheet being bonded to a surface of the ceramic substrate, in which a maximum length of a Mg—N compound phase which is present at a bonded interface between the copper sheet and the ceramic substrate is less than 100 nm, and in a unit length along the bonded interface, the number density of the Mg—N compound phase in a range of a length of 10 nm or more and less than 100 nm is less than 8 pieces/μm.

According to the insulated circuit board according to the present invention, since the maximum length of the Mg—N compound phase which is present at the bonded interface between the copper sheet and the ceramic substrate is less than 100 nm, and in the unit length along the bonded interface, the number density of the Mg—N compound phase in the range of the length of 10 nm or more and less than 100 nm is less than 8 pieces/μm, occurrence of electric field concentration caused by the Mg—N compound phase which is present at the bonded interface can be suppressed. Accordingly, the insulating property of the insulated circuit board can be sufficiently improved.

Here, in the insulated circuit board according to the present invention, it is preferable that the ceramic substrate includes silicon nitride phases and a glass phase formed between the silicon nitride phases, and that Cu atoms are present inside the glass phase located on a side of the copper sheet.

In this case, since the ceramic substrate includes the silicon nitride phases and the glass phase formed between the silicon nitride phases, and the Cu atoms are present inside the glass phase located on the copper sheet side, an interfacial reaction between the ceramic substrate and the copper sheet is sufficiently performed, and the bonding reliability is particularly excellent.

In the insulated circuit board according to the present invention, it is preferable that assuming that the total amount of Mg, N, and Si in the Mg—N compound phase is 100 atomic %, and the Si concentration is 25 atomic % or less.

In this case, since the Si concentration in the Mg—N compound phase is 25 atomic % or less, local precipitation of a Si single phase inside the Mg—N compound phase can be suppressed, and the strength of the Mg—N compound phase can be sufficiently secured. Thereby, it is possible to suppress cracks in the Mg—N compound phase when a load is applied to the bonded interface by ultrasonic bonding of a terminal material, and to maintain an anchor effect by the Mg—N compound phase.

A method for producing a copper-ceramic bonded body according to the present invention is a method for producing the copper-ceramic bonded body described above, the method including a Mg-disposing step of disposing Mg between the copper member and the ceramic member, a laminating step of laminating the copper member and the ceramic member with Mg interposed therebetween, and a bonding step of performing a heating treatment on the laminated copper member and ceramic member with Mg interposed therebetween in a state of being pressed in a lamination direction under a vacuum atmosphere to bond the copper member and the ceramic member to each other, in which, in the Mg-disposing step, an amount of Mg is in a range of 0.34 mg/cm$^2$ or more and 2.09 mg/cm$^2$ or less, and in the bonding step, a temperature integration value obtained from a value of multiplying a temperature and a time at a Mg—Si eutectic temperature (639° C.) or higher is in a range of 40° C.·h or higher and 420° C.·h or lower.

According to the method for producing a copper-ceramic bonded body having this configuration, in the Mg-disposing step, the amount of Mg is 0.34 mg/cm$^2$ or more, and in the bonding step, the temperature integration value obtained from a value of multiplying a temperature and a time at the Mg—Si eutectic temperature (639° C.) or higher is 40° C.·h or higher, so that a Cu—Mg liquid phase necessary for the interfacial reaction can be sufficiently obtained, and the copper member and the ceramic member can be reliably bonded to each other. Accordingly, the bonding reliability can be improved.

In addition, in the Mg-disposing step, the amount of Mg is 2.09 mg/cm$^2$ or less, and in the bonding step, the temperature integration value obtained from a value of multiplying a temperature and a time at the Mg—Si eutectic temperature (639° C.) or higher is 420° C.·h or lower, so that excessive formation and growth of the Mg—N compound phase at the bonded interface between the copper member and the ceramic member can be suppressed. Accordingly, the insulating property can be improved.

A method for producing an insulated circuit board according to the present invention is a method for producing the insulated circuit board described above, the method including a Mg-disposing step of disposing Mg between the copper sheet and the ceramic substrate, a laminating step of laminating the copper sheet and the ceramic substrate with Mg interposed therebetween, and a bonding step of performing a heating treatment on the laminated copper sheet and ceramic substrate with Mg interposed therebetween in a state of being pressed in a lamination direction under a vacuum atmosphere to bond the copper sheet and the ceramic substrate to each other, in which, in the Mg-disposing step, an amount of Mg is in a range of 0.34 mg/cm$^2$ or more and 2.09 mg/cm$^2$ or less, and in the bonding step, a temperature integration value obtained from a value of multiplying a temperature and a time at a Mg—Si eutectic temperature (639° C.) or higher is in a range of 40° C.·h or higher and 420° C.·h or lower.

According to the method for producing an insulated circuit board having this configuration, in the Mg-disposing step, the amount of Mg is 0.34 mg/cm$^2$ or more, and in the bonding step, the temperature integration value obtained from a value of multiplying a temperature and a time at the Mg—Si eutectic temperature (639° C.) or higher is 40° C.·h or higher, so that a Cu—Mg liquid phase necessary for the interfacial reaction can be sufficiently obtained, and the copper sheet and the ceramic substrate can be reliably bonded to each other. Accordingly, the bonding reliability can be improved.

In addition, in the Mg-disposing step, the amount of Mg is 2.09 mg/cm$^2$ or less, and in the bonding step, the temperature integration value obtained from a value of multiplying a temperature and a time at the Mg—Si eutectic temperature (639° C.) or higher is 420° C.·h or lower, so that excessive formation and growth of the Mg—N compound phase at the bonded interface between the copper sheet and the ceramic substrate can be suppressed. Accordingly, the insulating property can be improved.

Advantageous Effects of Invention

According to the present invention, it is possible to provide a copper-ceramic bonded body, an insulated circuit board, a method for producing a copper-ceramic bonded body, and a method for producing an insulated circuit board, which are excellent in insulating properties.

DESCRIPTION OF EMBODIMENTS

Hereinafter, an embodiment of the present invention will be described with reference to the accompanying drawings.

Figure 1:
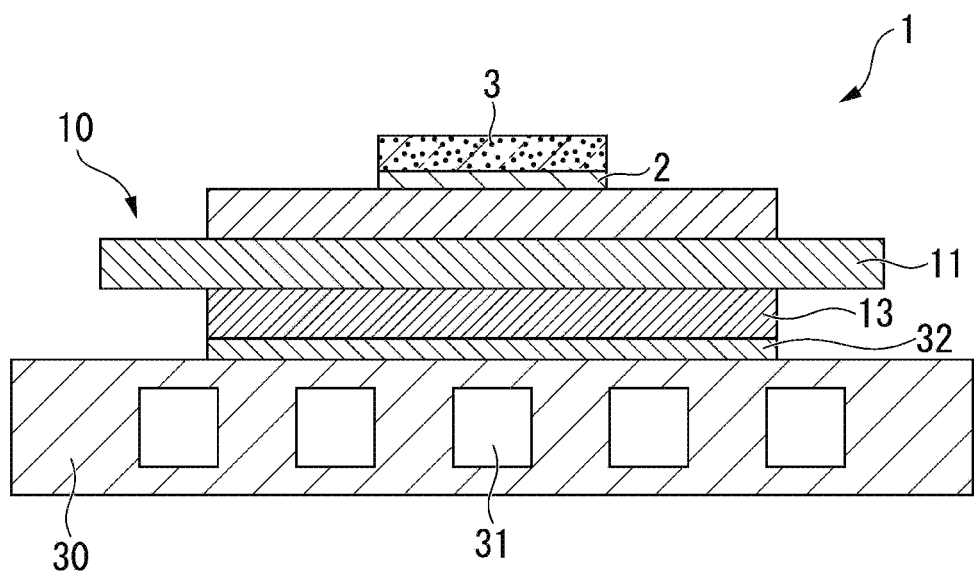
FIG. 1 is a schematic explanatory view of a power module using an insulated circuit board according to an embodiment of the present invention.

A copper-ceramic bonded body according to the present embodiment is an insulated circuit board 10 formed by bonding a ceramic substrate 11 as a ceramic member made of ceramics to a copper sheet 22 (circuit layer 12) and a copper sheet 23 (metal layer 13) as a copper member made of copper or a copper alloy. FIG. 1 shows a power module 1 including the insulated circuit board 10 according to the present embodiment.

The power module 1 includes the insulated circuit board 10 on which the circuit layer 12 and the metal layer 13 are disposed, a semiconductor element 3 bonded to one surface (upper surface in FIG. 1) of the circuit layer 12 with a bonding layer 2 interposed therebetween, and a heat sink 30 disposed on the other side (lower side in FIG. 1) of the metal layer 13.

The semiconductor element 3 is made of a semiconductor material such as Si. The semiconductor element 3 and the circuit layer 12 are bonded to each other with the bonding layer 2 interposed therebetween.

The bonding layer 2 is made of, for example, a Sn—Ag-based, Sn—In-based, or Sn—Ag—Cu-based solder material.

The heat sink 30 dissipates heat from the insulated circuit board 10 described above. The heat sink 30 is made of Cu or a Cu alloy, and in the present embodiment, the heat sink 30 is made of phosphorus deoxidized copper. The heat sink 30 is provided with a passage 31 through which a cooling fluid flows.

In the present embodiment, the heat sink 30 and the metal layer 13 are bonded to each other by a solder layer 32 made of a solder material. The solder layer 32 is made of, for example, a Sn—Ag-based, Sn—In-based, or Sn—Ag—Cu-based solder material.

As shown in FIG. 1, the insulated circuit board 10 of the present embodiment includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is made of silicon nitride ($Si_3N_4$) having excellent insulating property and heat radiation. The thickness of the ceramic substrate 11 is set to be in a range of, for example, 0.2 mm or more and 1.5 mm or less, and in the present embodiment, the thickness is set to 0.32 mm.

As shown in FIG. 6(a) to FIG. 6(c), the circuit layer 12 is formed by bonding the copper sheet 22 made of copper or a copper alloy to one surface (upper surface in FIG. 6(a) to FIG. 6(c) of the ceramic substrate 11.

In the present embodiment, the circuit layer 12 is formed by bonding the copper sheet 22 made of a rolled plate of oxygen-free copper to the ceramic substrate 11.

The thickness of the copper sheet 22 serving as the circuit layer 12 is set to be in a range of 0.1 mm or more and 2.0 mm or less, and in the present embodiment, the thickness is set to 0.6 mm.

As shown in FIG. 6(a) to FIG. 6(c), the metal layer 13 is formed by bonding the copper sheet 23 made of copper or a copper alloy to the other surface (lower surface in FIG. 6(a) to FIG. 6(c)) of the ceramic substrate 11.

In the present embodiment, the metal layer 13 is formed by bonding the copper sheet 23 made of a rolled plate of oxygen-free copper to the ceramic substrate 11.

The thickness of the copper sheet 23 serving as the metal layer 13 is set to be in a range of 0.1 mm or more and 2.0 mm or less, and in the present embodiment, the thickness is set to 0.6 mm.

At a bonded interface between the ceramic substrate 11 and the circuit layer 12 (metal layer 13), a Mg—N compound phase extending from a side of the ceramic substrate 11 to a side of the circuit layer 12 (metal layer 13) may be formed.

The Mg—N compound phase is formed by reacting magnesium (Mg) used as a bonding material with nitrogen (N) contained in the ceramic substrate 11.

Figure 2:
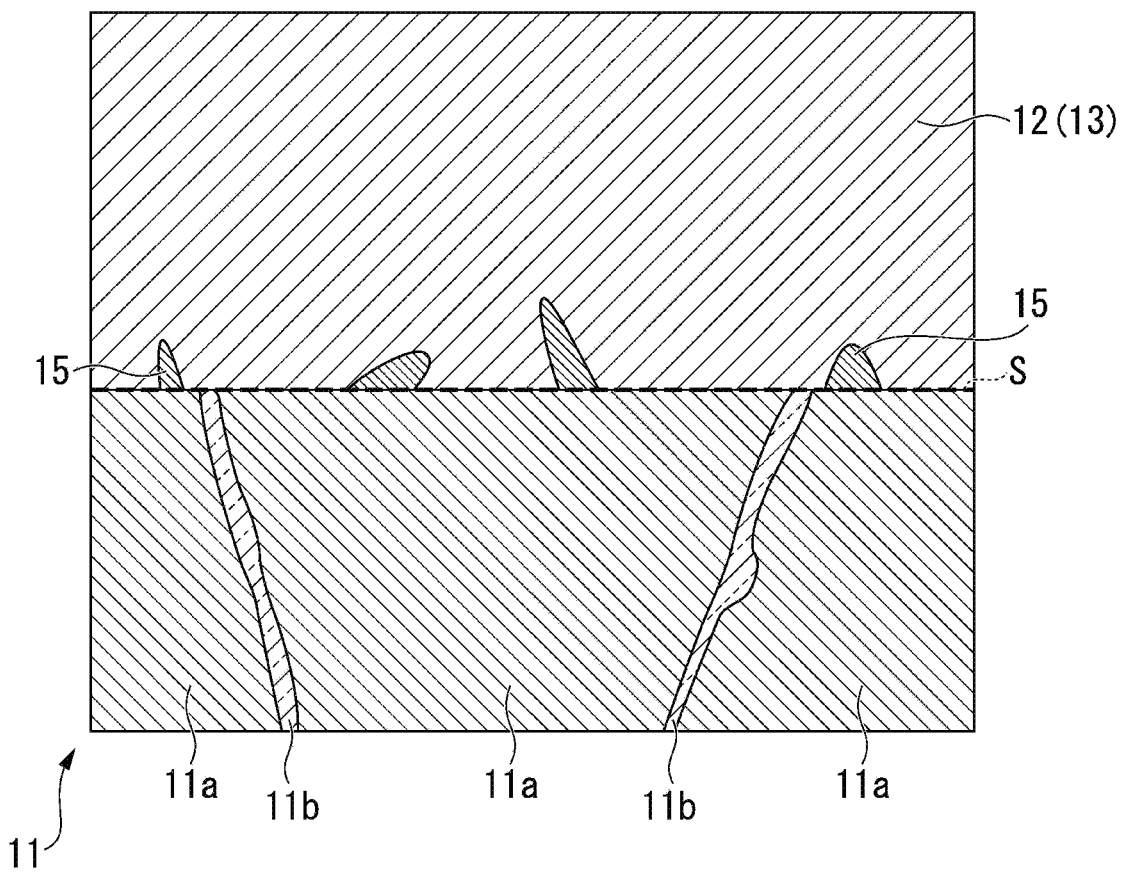
FIG. 2 is an enlarged explanatory view of a bonded interface between a circuit layer (metal layer) and of a ceramic substrate of the insulated circuit board according to the embodiment of the present invention.
Figure 4:
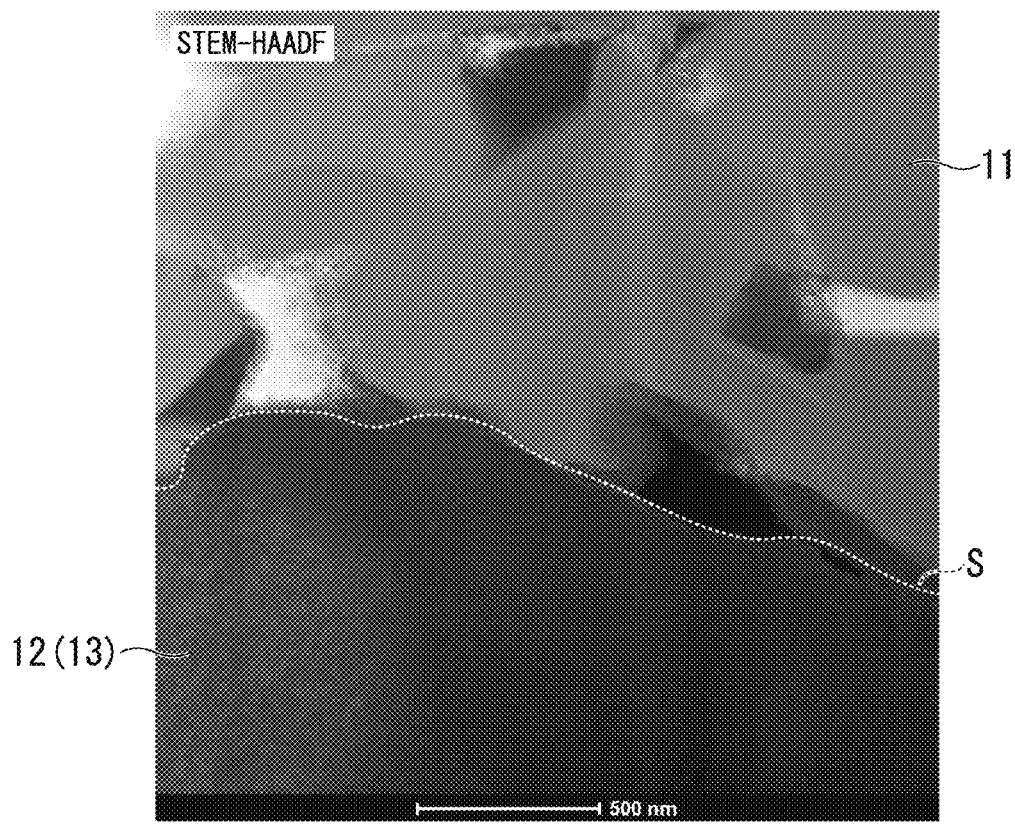
FIG. 4 is an observation result of the bonded interface between a circuit layer (metal layer) and the ceramic substrate of the insulated circuit board according to the embodiment of the present invention.

In the present embodiment, as shown in FIG. 2, when a cross section along a lamination direction of the ceramic substrate 11 and the circuit layer 12 (metal layer 13) is observed, the maximum length of a Mg—N compound phase 15 which is present at the bonded interface S between the ceramic substrate 11 and the circuit layer 12 (metal layer 13) is less than 100 nm, and in a unit length along the bonded interface S, the number density of the Mg—N compound phase 15 in a range of a length of 10 nm or more and less than 100 nm is less than 8 pieces/μm. The dotted line in FIG. 4 is the length along the bonded interface S.

Here, the length of the Mg—N compound phase 15 which is present at the bonded interface S is defined as follows.

Figure 3:
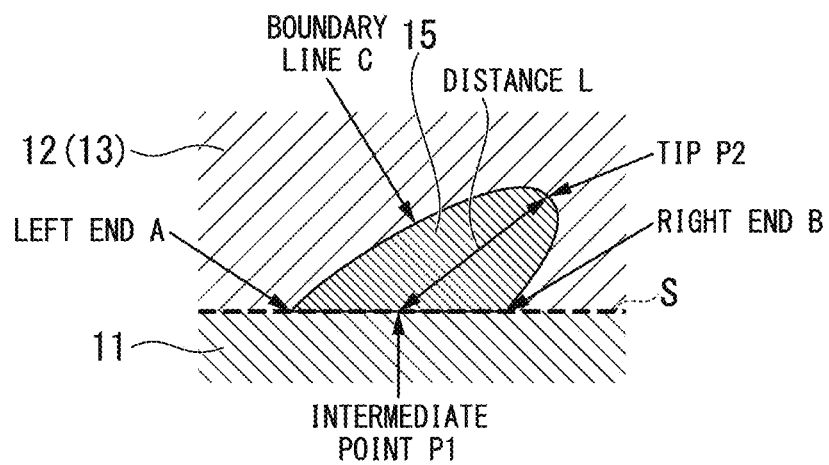
FIG. 3 is an explanatory view of a length of a Mg-N compound phase which is present at the bonded interface S in the insulated circuit board according to the embodiment of the present invention.

As shown in FIG. 3, contact points of the Mg—N compound phase 15 and the bonded interface S are defined as a left end A and a right end B, a point located in a half of the length along the bonded interface S from the left end A to the right end B is defined as an intermediate point P1, a boundary between the Mg—N compound phase 15 and the circuit layer 12 (metal layer 13) is defined as a boundary line C, and a tip of the boundary line C is defined as a tip P2. A distance L between the intermediate point P1 and the tip P2 is defined as the length.

The number density of the Mg—N compound phase 15 in a range of a length of 10 nm or more and less than 100 nm is preferably less than 5 pieces/μm, and more preferably less than 3 pieces/µm. The lower limit of the number density of the Mg—N compound phase 15 in the range of the length of 10 nm or more and less than 100 nm may be 0 pieces/µm.

The maximum length of the Mg—N compound phase 15 is preferably 10 nm or more.

Here, FIG. 4 shows observation results in the vicinity of the bonded interface S between the ceramic substrate 11 and the circuit layer 12 (metal layer 13). FIG. 4 is a STEM-HAADF image obtained by observing the cross section along the lamination direction of the ceramic substrate 11 and the circuit layer 12 (metal layer 13) using a Titan ChemiSTEM manufactured by FEI Company.

In FIG. 4, no clear Mg—N compound phase 15 is observed, and the number density of the Mg—N compound phase 15 in the range of the length of 10 nm or more and less than 100 nm is 0 pieces/µm.

In the insulated circuit board 10 according to the present embodiment, as shown in FIG. 2, it is preferable that the ceramic substrate 11 includes silicon nitride phases 11a and a glass phase 11b formed between the silicon nitride phases 11a, and that Cu atoms are present inside the glass phase 11b located on a side of the circuit layer 12 (metal layer 13).

The glass phase 11b is formed by a sintering aid used when sintering a raw material of silicon nitride, and is present at a grain boundary portion between the silicon nitride phases 11a.

Further, in the insulated circuit board 10 according to the present embodiment, it is preferable that assuming that the total amount of Mg, N, and Si in the Mg—N compound phase 15 is 100 atomic %, a Si concentration is 25 atomic % or less. In this case, since the Si concentration in the Mg—N compound phase 15 is 25 atomic % or less, local precipitation of a Si single phase inside the Mg—N compound phase 15 can be suppressed, and the strength of the Mg—N compound phase 15 can be sufficiently secured. Thereby, it is possible to suppress cracks in the Mg—N compound phase 15 when a load is applied to the bonded interface by ultrasonic bonding of a terminal material, and to maintain an anchor effect by the Mg—N compound phase 15.

The Si concentration is more preferably 20 atomic % or less, and the lower limit thereof is 5 atomic %.

Figure 5:
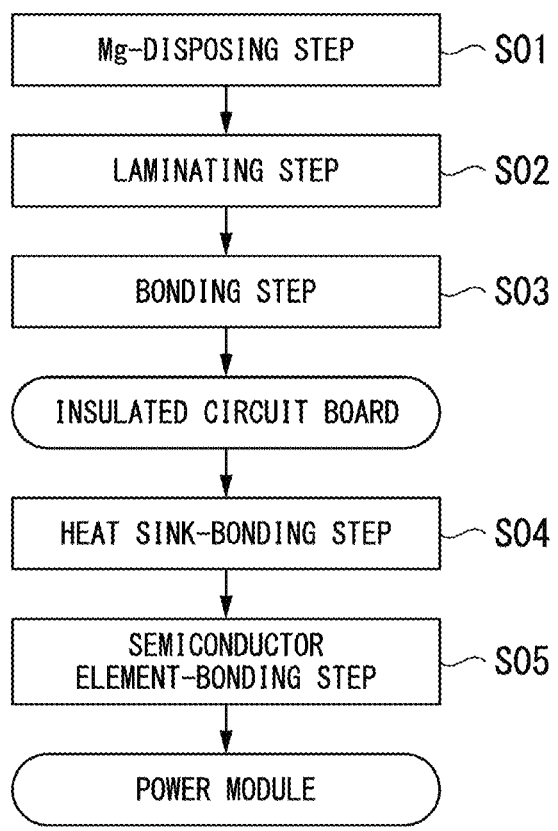
FIG. 5 is a flowchart of a method for producing the insulated circuit board according to the embodiment of the present invention.

Hereinafter, a method for producing the insulated circuit board 10 according to the present embodiment will be described with reference to FIGS. 5 and 6.

(Mg-Disposing Step S01)

Figure 6:
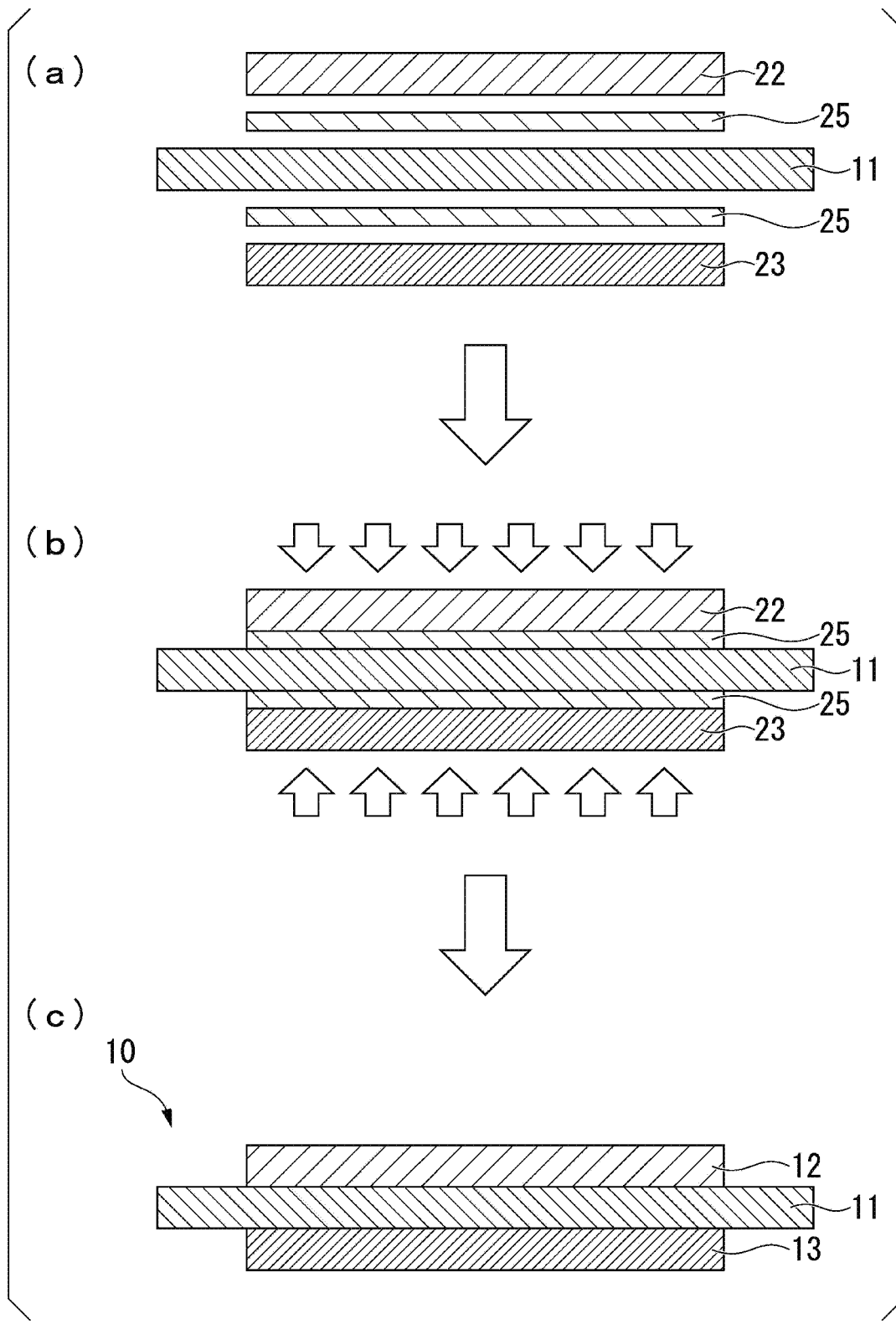
FIG. 6 is a schematic explanatory view of the method for producing the insulated circuit board according to the embodiment of the present invention, in which (a) is a Mg-disposing step, (b) is a bonding step, and (c) is an obtained insulated circuit board.

First, the ceramic substrate 11 made of silicon nitride ($Si_3N_4$) is prepared, and as shown in (a) of FIG. 6, Mg is disposed between the copper sheet 22 serving as the circuit layer 12 and the ceramic substrate 11, and between the copper sheet 23 serving as the metal layer 13 and the ceramic substrate 11.

In the present embodiment, a Mg foil 25 is disposed between the copper sheet 22 serving as the circuit layer 12 and the ceramic substrate 11, and between the copper sheet 23 serving as the metal layer 13 and the ceramic substrate 11.

Here, in the Mg-disposing step S0L the amount of Mg to be disposed is in a range of 0.34 mg/cm$^2$ or more and 2.09 mg/cm$^2$ or less.

By setting the amount of Mg to be disposed to 0.34 mg/cm$^2$ or more, a Cu—Mg liquid phase necessary for the interfacial reaction can be sufficiently obtained, and the copper sheet and the ceramic substrate can be reliably bonded to each other. On the other hand, by limiting the amount of Mg to be disposed to 2.09 mg/cm$^2$ or less, the excessive formation and growth of the Mg—N compound phase can be suppressed.

The lower limit of the amount of Mg to be disposed is preferably 0.43 mg/cm$^2$ or more, and more preferably 0.52 mg/cm$^2$ or more. On the other hand, the upper limit of the amount of Mg to be disposed is preferably 1.34 mg/cm$^2$ or less, and more preferably 1.04 mg/cm$^2$ or less.

(Laminating Step S02)

Next, the copper sheet 22 and the ceramic substrate 11 are laminated with the Mg foil 25 interposed therebetween, and the ceramic substrate 11 and the copper sheet 23 are laminated with the Mg foil 25 interposed therebetween.

(Bonding Step S03)

Next, as shown in (b) of FIG. 6, the copper sheet 22, the Mg foil 25, the ceramic substrate 11, the Mg foil 25, and the copper sheet 23, which are laminated, are pressed in the lamination direction, and are loaded into a vacuum furnace and heated such that the copper sheet 22, the ceramic substrate 11, and the copper sheet 23 are bonded together.

Here, in the bonding step S03, the temperature rising rate, the holding temperature, the holding time, and the temperature dropping rate are set such that the temperature integration value obtained from a value of multiplying the temperature and the time at the Mg—Si eutectic temperature (639° C.) or higher is set to be in a range of 40° C.·h or higher and 420° C.·h or lower.

Here, since the temperature integration value obtained from the value of multiplying the temperature and the time at the Mg—Si eutectic temperature (639° C.) or higher is set to 40° C.·h or higher, the Cu—Mg liquid phase necessary for the interfacial reaction can be sufficiently obtained, and the copper sheet and the ceramic substrate can be reliably bonded to each other. On the other hand, since the above-described temperature integration value is set to 420° C.·h or lower, the excessive formation and growth of the Mg—N compound phase can be suppressed.

The lower limit of the temperature integration value obtained from the value of multiplying the temperature and the time at the Mg—Si eutectic temperature (639° C.) or higher is preferably 100° C.·h or higher, and more preferably 150° C.·h or higher. On the other hand, the upper limit of the temperature integration value obtained from the value of multiplying the temperature and the time at the Mg—Si eutectic temperature (639° C.) or higher is preferably 400° C.·h or lower, more preferably 350° C.·h or lower, and still more preferably 300° C.·h or lower.

A pressing load in the bonding step S03 is preferably in a range of 0.049 MPa or more and 3.4 MPa or less.

Further, a degree of vacuum in the bonding step S03 is preferably in a range of $1 \times 10^{-6}$ Pa or more and $5 \times 10^{-2}$ Pa or less.

As described above, the insulated circuit board 10 according to the present embodiment shown in (c) of FIG. 6 is produced by the Mg-disposing step S01, the laminating step S02, and the bonding step S03.

(Heat Sink-Bonding Step S04)

Next, the heat sink 30 is bonded to the other surface side of the metal layer 13 of the insulated circuit board 10.

The insulated circuit board 10 and the heat sink 30 are laminated with a solder material interposed therebetween and are loaded into a heating furnace such that the insulated circuit board 10 and the heat sink 30 are solder-bonded to each other with the solder layer 32 interposed therebetween.

(Semiconductor Element-Bonding Step S05)

Next, the semiconductor element 3 is bonded to one surface of the circuit layer 12 of the insulated circuit board 10 by soldering.

The power module 1 shown in FIG. 1 is produced by the above steps.

According to the insulated circuit board 10 (copper-ceramic bonded body) according to the present embodiment having the above configuration, since the maximum length of the Mg—N compound phase 15 which is present at the bonded interface between the circuit layer 12 (and the metal layer 13) and the ceramic substrate 11 is less than 100 nm, and in the unit length along the bonded interface, the number density of the Mg—N compound phase 15 in the range of the length of 10 nm or more and less than 100 nm is less than 8 pieces/μm, occurrence of electric field concentration caused by the Mg—N compound phase 15 which is present at the bonded interface can be suppressed. Accordingly, the insulating property of the insulated circuit board 10 can be sufficiently improved.

In the insulated circuit board 10 according to the present embodiment, when the ceramic substrate 11 includes the silicon nitride phases 11a and the glass phase 11b formed between the silicon nitride phases 11a, and Cu atoms are present inside the glass phase 11b located on the circuit layer 12 (and the metal layer 13) side, an interfacial reaction between the ceramic substrate 11 and the copper sheets 22 and 23 is sufficiently performed, and bonding reliability between the circuit layer 12 (and the metal layer 13) and the ceramic substrate 11 is particularly excellent.

In the insulated circuit board 10 according to the present embodiment, assuming that the total amount of Mg, N, and Si in the Mg—N compound phase 15 is 100 atomic %, the Si concentration is 25 atomic % or less. In this case, local precipitation of a Si single phase inside the Mg—N compound phase 15 can be suppressed, and the strength of the Mg—N compound phase 15 can be sufficiently secured.

According to the method for producing the insulated circuit board 10 (copper-ceramic bonded body) according to the present embodiment, in the Mg-disposing step S01, the amount of Mg is 0.34 mg/cm$^2$ or more, and in the bonding step S03, the temperature integration value obtained from the value of multiplying a temperature and a time at the Mg—Si eutectic temperature (639° C.) or higher is 40° C.·h or higher, so that a Cu—Mg liquid phase necessary for the interfacial reaction can be sufficiently obtained, and the copper sheets 22 and 23 and the ceramic substrate 11 can be reliably bonded to each other.

In addition, in the Mg-disposing step S01, the amount of Mg is 2.09 mg/cm$^2$ or less, and in the bonding step S03, the temperature integration value obtained from the value of multiplying a temperature and a time at the Mg—Si eutectic temperature (639° C.) or higher is 420° C.·h or lower, so that excessive formation and growth of the Mg—N compound phase at the bonded interface between the circuit layer 12 (and the metal layer 13) and the ceramic substrate 11 can be suppressed.

The embodiment of the present invention has been described, but the present invention is not limited thereto, and can be appropriately changed without departing from the technical ideas of the present invention.

For example, in the present embodiment, the semiconductor element is mounted on the insulated circuit board to form the power module, but the present embodiment is not limited thereto. For example, an LED element may be mounted on the circuit layer of the insulated circuit board to form an LED module, or a thermoelectric element may be mounted on the circuit layer of the insulated circuit board to form a thermoelectric module.

In the insulated circuit board according to the present embodiment, it has been described that the circuit layer and the metal layer are both made of a copper sheet made of copper or a copper alloy, but the present invention is not limited thereto.

For example, in a case where the circuit layer and the ceramic substrate are made of the copper-ceramic bonded body according to the present invention, there is no limitation on the material and the bonding method of the metal layer. There may be no metal layer, the metal layer may be made of aluminum or an aluminum alloy, or may be made of a laminate of copper and aluminum.

On the other hand, in a case where the metal layer and the ceramic substrate are made of the copper-ceramic bonded body according to the present invention, there is no limitation on the material and the bonding method of the circuit layer. The circuit layer may be made of aluminum or an aluminum alloy, or may be made of a laminate of copper and aluminum.

Further, in the present embodiment, it has been described that the Mg foil is laminated between the copper sheet and the ceramic substrate in the Mg-disposing step, but the present invention is not limited thereto, and a thin film made of Mg may be formed on the bonding surface of the ceramic substrate and the copper sheet by a sputtering method, a vapor deposition method, or the like. In addition, a paste using Mg or $MgH_2$ may be applied.

EXAMPLES

Hereinafter, results of confirmation experiments performed to confirm the effects of the present invention will be described.

Example 1

First, a ceramic substrate (40 mm×40 mm×0.32 mm) made of a ceramic substrate made of silicon nitride ($Si_3N_4$) was prepared.

A copper sheet (37 mm×37 mm×thickness of 0.6 mm) made of oxygen-free copper was bonded to both surfaces of the ceramic substrate under the conditions of the Mg-disposing step and the bonding step shown in Table 1 to obtain an insulated circuit board (copper-ceramic bonded body). The degree of vacuum of a vacuum furnace at the time of bonding was set to $2 \times 10^{-3}$ Pa.

For the obtained insulated circuit board (copper-ceramic bonded body), the maximum length of the Mg—N compound phase at the bonded interface, the number density of the Mg—N compound phase in the range of the length of 10 nm or more and less than 100 nm, the presence or absence of Cu atoms inside the glass phase, the bonding rate after a thermal cycle, and the dielectric breakdown voltage were evaluated as follows.

(Mg—N Compound Phase)

The bonded interface between the copper sheet and the ceramic substrate was observed using a transmission electron microscope (Titan ChemiSTEM manufactured by FEI Company) at an acceleration voltage of 200 kV and a magnification of 20,000×, and the Mg—N compound phase was recognized when a region where Mg and N coexisted was present and the concentration of Mg was 40 atomic % or more and 65 atomic % or less with the total of Mg, N, and Si being 100 atomic % in the region.

The maximum length of the Mg—N compound phase and the number density of the Mg—N compound phase in the range of the length of 10 nm or more and less than 100 nm in the unit length along the bonded interface were calculated.

The maximum length of the Mg—N compound phase was measured by extracting, in the cross section of the copper-ceramic bonded body, the Mg—N compound phase in the field of view (2 μm×2 μm) when the bonded interface was observed using a transmission electron microscope (Titan ChemiSTEM manufactured by FET Company), and by measuring the length of the Mg—N compound phase according to the above definition. The measurement was performed in 5 fields of view in each copper-ceramic bonded body, and the length of the Mg—N compound phase, which had the largest length, was shown as the maximum length of the Mg—N compound phase.

The number density (pieces/μm) of the Mg—N compound phase was calculated by counting the number of the Mg—N compound phases in the range of the length of 10 nm or more and less than 100 nm in the unit length along the bonded interface between the copper sheet and the ceramic substrate in the field of view (2 μm×2 μm) when the cross section of the copper-ceramic bonded body cut along the lamination direction of the copper-ceramic bonded body was observed using a transmission electron microscope (Titan ChemiSTEM manufactured by FET Company). The measurement was performed in 5 fields of view, and an average value was shown as the number density (pieces/μm).

The evaluation results are shown in Table 1. The maximum length of the Mg—N compound phase and the number density of the Mg—N compound phase were measured by excluding the Mg—N compound phase which was present at the boundary of the measurement field and could not be grasped as a whole.

(Cu Atom Inside Glass Phase)

The cross section of the ceramic substrate was observed using a transmission electron microscope (Titan ChemiSTEM manufactured by FE1 Company; acceleration voltage of 200 kV) to confirm the presence or absence of Cu atoms in the glass phase.

The glass phase was a region in which Si was less than 15 atomic % and O was 3 atomic % or more and 25 atomic % or less assuming that the total amount of Cu, Si, O, and N was 100 atomic %. The evaluation results are shown in Table 1.

(Bonding Rate after Loading of Thermal Cycle)

Using a thermal shock tester (TSA-72ES manufactured by ESPEC Corp.), 800 cycles, where one cycle is 5 minutes at −40° C. and 5 minutes at 175° C., were performed on the insulated circuit board in a gas phase. After that, the bonding rate between the ceramic substrate and the copper sheet was evaluated as follows.

For the evaluation of the bonding rate, the bonding rate at the interface between the ceramic substrate and the copper sheet (circuit layer and metal layer) was evaluated using an ultrasonic flaw detector (FineSAT200 manufactured by Hitachi Power Solutions Co., Ltd.) with respect to the insulated circuit board, and the bonding rate was calculated from the following equation.

Here, the initial bonding area was the area to be bonded before bonding, that is, the area (37 mm×37 mm) of the circuit layer and the metal layer in the present example.

(Bonding rate)={(initial bonding area)−(peeled area)}/(initial bonding area)

In an image obtained by binarizing an ultrasonic-detected image, peeling was indicated by a white portion in the bonding part, and thus the area of the white portion was regarded as a peeled area. These results are shown in Table 1.

(Dielectric Breakdown Voltage)

The front and back surfaces of the insulated circuit board after loading of the thermal cycle were interposed between electrodes, a process of increasing the voltage by 0.5 kV at a boosting speed of 1 kV/sec and performing holding for 30 seconds was repeated, and the voltage at the time of dielectric breakdown was used as the dielectric breakdown voltage. In the present example, the voltage when a current of 1 mA or more flowed was defined as the dielectric breakdown voltage. The evaluation results are shown in Table 1.

TABLE 1

| | Mg-disposing step | Bonding step | | Mg-N compound phase | | Presence or absence of Cu atoms inside glass phase | Bonding rate after loading of thermal cycle (%) | Dielectric breakdown voltage (kV) |
|---|---|---|---|---|---|---|---|---|
| | Amount of Mg mg/cm$^2$ | Load MPa | Temperature integration value[X1] ° C. · h | Maximum length (nm) | Number density[X2] (pieces/μm) | | | |
| Present Invention Example 1 | 0.34 | 0.49 | 41 | 13 | 0.2 | Absent | 91.2 | 7.5 |
| Present Invention Example 2 | 1.04 | 1.47 | 104 | 22 | 1.0 | Absent | 92.8 | 7.5 |
| Present Invention Example 3 | 2.09 | 0.98 | 346 | 93 | 7.8 | Present | 96.8 | 7.0 |
| Present Invention Example 4 | 1.39 | 1.47 | 397 | 98 | 7.4 | Present | 95.9 | 7.0 |
| Present Invention Example 5 | 0.52 | 0.98 | 153 | 23 | 4.6 | Present | 95.7 | 8.5 |
| Present Invention Example 6 | 0.70 | 0.98 | 235 | 47 | 4.9 | Present | 94.0 | 8.5 |
| Present Invention Example 7 | 1.04 | 0.49 | 276 | 70 | 6.3 | Present | 96.5 | 8.0 |
| Present Invention Example 8 | 0.70 | 0.98 | 298 | 81 | 7.2 | Present | 94.6 | 8.0 |
| Comparative Example 1 | 2.61 | 0.98 | 235 | 126 | 16.1 | Present | 94.8 | 5.5 |
| Comparative Example 2 | 1.04 | 0.49 | 503 | 143 | 12.6 | Present | 94.8 | 5.0 |
| Comparative Example 3 | 0.17 | 1.47 | 397 | — | — | — | — | — |
| Comparative Example 4 | 2.09 | 0.98 | 19 | — | — | — | — | — |

[X1]Temperature integration value: value obtained by multiplying temperature and time at Mg-Si eutectic temperature (639° C.) or higher
[X2]Number density of Mg-N compound phase having length of 10 nm or more and less than 100 nm at bonded interface In Comparative Example 1 in which the amount of Mg in the Mg-disposing step was 2.61 mg/cm², the maximum length of the Mg—N compound phase exceeded 100 nm, and the number density of the Mg—N compound phase having the length of 10 nm or more and less than 100 nm exceeded 8 pieces/μm. Therefore, the dielectric breakdown voltage was as low as 5.5 kV, and the insulating property was insufficient.

In Comparative Example 2 in which the temperature integration value in the bonding step was 503° C.·h, the maximum length of the Mg—N compound phase exceeded 100 nm, and the number density of the Mg—N compound phase having the length of 10 nm or more and less than 100 nm exceeded 8 pieces/μm. Therefore, the dielectric breakdown voltage was as low as 5.0 kV, and the insulating property was insufficient.

In Comparative Example 3 in which the amount of Mg in the Mg-disposing step was 0.17 mg/cm², the maximum length of the Mg—N compound phase was less than 10 nm. Therefore, the bonding was poor and other evaluations were discontinued.

In Comparative Example 4 in which the temperature integration value in the bonding step was 19° C.·h, the maximum length of the Mg—N compound phase was less than 10 nm. Therefore, the bonding was poor and other evaluations were discontinued. The liquid phase was sufficiently generated, but it is presumed that the reaction was insufficient.

On the other hand, in Present Invention Examples 1 to 8 in which the maximum length of the Mg—N compound phase which is present at the bonded interface was less than 100 nm and the number density of the Mg—N compound phase in the range of the length of 10 nm or more and less than 100 nm in the unit length along the bonded interface was less than 8 pieces/μm, the dielectric breakdown voltage was 7.0 kV or more and the insulating property was excellent.

Further, in Present Invention Examples 3 to 8 in which Cu atoms were present inside the glass phase, the bonding rate after loading of the thermal cycle was high, and the bonding reliability was excellent.

Example 2

A ceramic substrate (40 mm×40 mm×0.32 mm) made of a ceramic substrate made of silicon nitride ($Si_3N_4$) was prepared.

A copper sheet (37 mm×37 mm×thickness of 0.6 mm) made of oxygen-free copper was bonded to both surfaces of the ceramic substrate under the conditions shown in Table 2 to obtain an insulated circuit board (copper-ceramic bonded body). The degree of vacuum of a vacuum furnace at the time of bonding was set to $2\times10^{-3}$ Pa.

For the obtained insulated circuit board (copper-ceramic bonded body), the maximum length of the Mg—N compound phase at the bonded interface, the number density of the Mg—N compound phase in the range of the length of 10 nm or more and less than 100 nm, and the presence or absence of Cu atoms inside the glass phase were evaluated in the same manner as in Example 1. The evaluation results are shown in Table 2.

In addition, the Si concentration in the Mg—N compound phase, the bonding rate after the furnace passing test, and the insulating property were evaluated as follows.

(Si Concentration in Mg—N Compound Phase)

An observation specimen was collected from the central portion of the obtained insulated circuit board (copper-ceramic bonded body), and the bonded interface between the copper sheet and the ceramic substrate was observed at an acceleration voltage of 200 kV and a magnification of 20,000× by using a transmission electron microscope (Titan ChemiSTEM manufactured by FEI Company), and the Si concentration was measured in a region (that is, the Mg—N compound phase described above) where Mg and N coexisted, in which the total of Mg, N, and Si was 100 atomic %.

(Bonding Rate after Loading of Thermal Cycle)

After loading 5 times of a thermal cycle, where one cycle is 2 minutes at −78° C. and 2 minutes at 350° C., the bonding rate between the ceramic substrate and the copper sheet was evaluated in the same manner as in Example 1. The evaluation results are shown in Table 2.

(Insulation Evaluation)

The front and back surfaces of the insulated circuit board after loading of the furnace passing test were interposed between electrodes, a process of increasing the voltage by 0.5 kV at a boosting speed of 1 kV/sec and performing holding for 30 seconds was repeated, and the voltage when the discharge charge exceeded 10 pC was used as the partial discharge inception voltage. The evaluation results are shown in Table 2.

TABLE 2

| | Mg-disposing step | Bonding step | | Mg-N compound phase | | | Presence or absence of Cu atoms inside glass phase | Bonding rate after loading of thermal cycle (%) | Partial discharge inception voltage (kV) |
|---|---|---|---|---|---|---|---|---|---|
| | Amount of Mg mg/cm² | Load MPa | Temperature integration value[X1] ° C.·h | Maximum length (nm) | Si concentration (atomic %) | Number density[X2] (pieces/μm) | | | |
| Present Invention Example 11 | 0.52 | 0.98 | 130 | 23 | 6.1 | 3.9 | Present | 90.3 | 7.1 |
| Present Invention Example 12 | 0.52 | 0.98 | 153 | 23 | 5.4 | 4.6 | Present | 91.2 | 7.1 |
| Present Invention Example 13 | 0.52 | 1.47 | 195 | 38 | 7.4 | 5.1 | Present | 92.1 | 7.0 |
| Present Invention Example 14 | 0.70 | 0.98 | 235 | 47 | 9.0 | 4.9 | Present | 91.5 | 6.8 |
| Present Invention Example 15 | 1.39 | 1.47 | 235 | 73 | 13.2 | 5.5 | Present | 92.2 | 6.7 |
| Present Invention Example 16 | 1.39 | 1.47 | 153 | 33 | 6.5 | 4.9 | Present | 92.0 | 7.0 |
| Present Invention Example 17 | 1.04 | 0.49 | 276 | 70 | 18.8 | 6.3 | Present | 92.4 | 6.6 |

TABLE 2-continued

| | Mg-disposing step | Bonding step | | | | | Bonding rate after | Partial discharge |
|---|---|---|---|---|---|---|---|---|
| | | | | Mg-N compound phase | | | | |
| | | | Temperature | | | | | |
| | | | | | | Presence or | loading | discharge |
| | Amount of Mg mg/cm$^2$ | Load MPa | integration value[X1] ° C. · h | Maximum length (nm) | Si concentration (atomic %) | Number density[X2] (pieces/μm) | absence of Cu atoms inside glass phase | of thermal cycle (%) | inception voltage (kV) |
| Present Invention Example 18 | 1.04 | 0.49 | 346 | 91 | 24.1 | 7.7 | Present | 92.5 | 6.5 |
| Present Invention Example 19 | 2.09 | 0.49 | 397 | 95 | 24.8 | 7.9 | Present | 92.6 | 6.5 |
| Present Invention Example 20 | 1.04 | 1.96 | 420 | 97 | 26.3 | 7.9 | Present | 92.4 | 6.2 |
| Comparative Example 11 | 3.74 | 0.49 | 531 | 174 | 30.2 | 15.4 | Present | 92.8 | 4.9 |

[X1]Temperature integration value: value obtained by multiplying temperature and time at Mg-Si eutectic temperature (639° C.) or higher
[X2]Number density of Mg-N compound phase having length of 10 nm or more and less than 100 nm at bonded interface In Comparative Example 11 in which the amount of Mg in the Mg-disposing step was 3.741 mg/cm$^2$, the maximum length of the Mg—N compound phase exceeded 100 nm, the number density of the Mg—N compound phase having the length of 10 nm or more and less than 100 nm exceeded 8 pieces/μm, and the Si concentration in the Mg—N compound phase exceeded 25 atomic %. Therefore, the partial discharge inception voltage after loading of the thermal cycle was as low as 4.9 kV, and the insulating property was insufficient.

On the other hand, in Present Invention Examples 11 to 19 in which the maximum length of the Mg—N compound phase which was present at the bonded interface was less than 100 nm, the number density of the Mg—N compound phase in the range of the length of 10 nm or more and less than 100 nm in the unit length along the bonded interface was less than 8 pieces/μm, and the Si concentration in the Mg—N compound phase was 25 atomic % or less, the partial discharge inception voltage after loading of the thermal cycle was 6.5 kV or more and the insulating property was excellent.

From comparison among Present Invention Examples 11 to 19, it was confirmed that the Si concentration in the Mg—N compound phase was suppressed to be low, thereby increasing the partial discharge inception voltage after loading of the thermal cycle and further improving the insulating property.

As a result of the above, according to Present Invention Examples, it was confirmed that it is possible to provide a copper-ceramic bonded body, an insulated circuit board, a method for producing a copper-ceramic bonded body, and a method for producing an insulated circuit board, which are excellent in insulating properties.

REFERENCE SIGNS LIST

10: Insulated circuit board (copper-ceramic bonded body)
11: Ceramic substrate (ceramic member)
11a: Silicon nitride phase
11b: Glass phase
12: Circuit layer (copper member)
13: Metal layer (copper member)
15: Mg—N compound phase

What is claimed is:

1. A copper-ceramic bonded body comprising:
a copper member made of copper or a copper alloy; and
a ceramic member made of silicon nitride,
wherein the copper member and the ceramic member are bonded to each other,
only Mg—N compound phase is present at a bonded interface between the copper member and the ceramic member, wherein assuming that a total amount of Mg, N, and Si in the Mg—N compound phase is 100 atomic %, a Si concentration is 25 atomic % or less,
a maximum length of the Mg—N compound phase is less than 100 nm, and
in a unit length along the bonded interface, a number density of the Mg—N compound phase in a range of a length of 10 nm or more and less than 100 nm is less than 8 pieces/μm.

2. The copper-ceramic bonded body according to claim 1, wherein the ceramic member includes silicon nitride phases and a glass phase formed between the silicon nitride phases, and
Cu atoms are present inside the glass phase located on a side of the copper member.

3. An insulated circuit board comprising:
a copper sheet made of copper or a copper alloy; and
a ceramic substrate made of silicon nitride,
wherein the copper sheet is bonded to a surface of the ceramic substrate,
only Mg—N compound phase is present at a bonded interface between the copper sheet and the ceramic substrate, wherein assuming that a total amount of Mg, N, and Si in the Mg—N compound phase is 100 atomic %, a Si concentration is 25 atomic % or less,
a maximum length of the Mg—N compound phase is less than 100 nm, and
in a unit length along the bonded interface, a number density of the Mg—N compound phase in a range of a length of 10 nm or more and less than 100 nm is less than 8 pieces/μm.

4. The insulated circuit board according to claim 3, wherein the ceramic substrate includes silicon nitride phases and a glass phase formed between the silicon nitride phases, and
Cu atoms are present inside the glass phase located on a side of the copper sheet.

5. A method for producing the copper-ceramic bonded body according to claim 1, the method comprising:
a Mg-disposing step of disposing Mg between the copper member and the ceramic member;
a laminating step of laminating the copper member and the ceramic member with Mg interposed therebetween; and a bonding step of performing a heating treatment on the laminated copper member and ceramic member with Mg interposed therebetween in a state of being pressed in a lamination direction under a vacuum atmosphere to bond the copper member and the ceramic member to each other, wherein, in the Mg-disposing step, an amount of Mg is in a range of 0.34 mg/cm$^2$ or more and 2.09 mg/cm$^2$ or less, in the laminating step, Mg comes in contact with the copper member and Mg comes in contact with the ceramic member, and in the bonding step, a temperature integration value obtained from a value of multiplying a temperature and a time at a Mg—Si eutectic temperature (639° C.) or higher is in a range of 40° C.·h or higher and 420° C.·h or lower.

6. A method for producing the insulated circuit board according to claim 3, the method comprising:

a Mg-disposing step of disposing Mg between the copper sheet and the ceramic substrate;

a laminating step of laminating the copper sheet and the ceramic substrate with Mg interposed therebetween;

in the laminating step, Mg comes in contact with the copper member and Mg comes in contact with the ceramic member, and a bonding step of performing a heating treatment on the laminated copper sheet and ceramic substrate with Mg interposed therebetween in a state of being pressed in a lamination direction under a vacuum atmosphere to bond the copper sheet and the ceramic substrate to each other, wherein, in the Mg-disposing step, an amount of Mg is in a range of 0.34 mg/cm$^2$ or more and 2.09 mg/cm$^2$ or less, and in the bonding step, a temperature integration value obtained by multiplying a temperature and a time at a Mg—Si eutectic temperature (639° C.) or higher is in a range of 40° C.·h or higher and 420° C.·h or lower.

* * * * *